United States Patent [19]
Burkin

[11] 4,047,288
[45] Sept. 13, 1977

[54] METHOD OF MANUFACTURING 3-D MEMORIES

[76] Inventor: Jury Alexandrovich Burkin, Tsvetnoi proezd, 29, kv. 24, Novosibirsk, U.S.S.R.

[21] Appl. No.: 667,585

[22] Filed: Mar. 17, 1976

Related U.S. Application Data

[63] Continuation of Ser. No. 562,118, March 26, 1975, abandoned.

[30] Foreign Application Priority Data

Apr. 3, 1974  U.S.S.R. .............................. 2011776
Apr. 8, 1974  U.S.S.R. .............................. 2016331

[51] Int. Cl.² ............................................. H01F 41/08
[52] U.S. Cl. ...................................... 29/604; 29/433; 29/737; 340/174 MA
[58] Field of Search .............. 29/604, 203 MM, 240.5, 29/241, 433, 737; 340/174 MA; 140/92.4, 92.2, 92.8, 92.3

[56] References Cited
U.S. PATENT DOCUMENTS

| | | | |
|---|---|---|---|
| 3,435,518 | 4/1969 | Denes | 29/604 |
| 3,772,755 | 11/1973 | Draving | 29/604 X |
| 3,858,294 | 1/1975 | Burkin et al. | 29/604 X |

*Primary Examiner*—Carl E. Hall
*Attorney, Agent, or Firm*—Holman & Stern

[57] ABSTRACT

A method of manufacturing triple coincidence access 3-D memories (requiring 3 inputs for memory access) which, according to the invention, consists in making a flat core matrix threaded along three directions of the Cartesian system, the matrix is then positioned opposite the place of manufacturing a subsequent flat matrix, every matrix is secured in the position provided for it in the 3-D memory being manufactured and in which the subsequent weaving procedure is carried out until the preset number of matrices for the 3-D memory is obtained. A device realizing the proposed procedure which comprises pick-up point assemblies securing wires along the Y-coordinate direction, a roll having a longitudinal guide made as a groove transverse to the wires, a mechanism coiling the wire that threads a row of cores along the X-coordinate direction, means for straightening the wire and for positioning the line of threaded cores in corresponding places of the flat matrix and which, according to the invention, is provided with a stack of threaded flat matrices positioned opposite the place of matrix threading, means for securing matrices, pick-up point assemblies to which the wires running along the Z-coordinate direction are attached with one end while the other end of every wire has a needle secured to it and all needles are fastened with intercepting combs, and means for inserting the needles into the holes of cores, said means being made as a guide directing the displacement of said intercepting comb.

4 Claims, 4 Drawing Figures

METHOD OF MANUFACTURING 3-D MEMORIES

This is a continuation of application Ser. No. 562,198 filed Mar. 26 1975, now abandoned.

BACKGROUND OF THE INVENTION

The present invention relates generally to the process of threading ferrite core memories with wires to manufacture memory devices for electronic computers, logical automatic machines, control communications and test circuits and in particular, to a method and apparatus for manufacturing 3-D memories.

The prior art teaches only a manual procedure of manufacturing 3-D memories in which every core is threaded with two or three wires along the three axes of the Cartesian system. Such memories are inherently of very low capacities and were used in the first computers when memory devices were made of bulky ferrite cores. The manual manufacturing procedure consisted in sequential threading of every core included in the 3-D memory with wires in three mutually orthogonal directions.

Insurmountable engineering problems, extremely low storage capacities, lack of maintainability, on the one hand, and the development of advanced topologies for flat 2-D matrices, on the other, underlie the need for 3-D memories which would enjoy major advantages with respect to flat memories but are not in use in the modern computer technology and are considered feasible only theoretically.

Among the drawbacks of the manual threading of cores in 3-D memories are exceedingly low labour efficiency, overloads for the eyes of the assembly-man, impossibility of testing the quality of cores in the course of threading and no means of repairing damaged cores inside the memory. These drawbacks limit the capacity of such memories and make them extremely expensive.

Known in the art are a number of various procedures of manufacturing flat 2-D ferrite matrices. One of them which is functionally the closest to the procedure of manufacturing 3-D memories proposed herein consists in that ferrite cores are strung beforehand in columns onto wires running along the Y-coordinate direction, and these wires are positioned in a row on a frame parallel to one another and secured in pick-up point assemblies with slight tension. Then a single core is detached from every column. The detached cores are oriented in a row along the X-coordinate direction and the row of oriented cores threaded with a wire coiled into a helix in such a way that when the helix is rotated and fed in simultaneously its end will thread all the cores in the row one by one. Then the helix is straightened to form a matrix line in the X-coordinate direction. The cores on the threaded line are tested and the damaged ones, if any, are rejected, after which the assembled line is secured in the place provided for it in the flat matrix being manufactured. The subsequent weaving procedure is carried out in a similar way line by line until the matrix is complete.

A drawback of this method consists in that it can not be used to manufacture 3-D memories in which coordinate wires would run along three mutually orthogonal directions in volume.

A device for manufacturing 2-D matrices of ferrite cores which realises the above method comprises pick-up point assemblies securing wires with cores strung onto them and a folder mounted on the frame of the device and made as a roll having a longitudinal guide in the form of a groove which detaches a line of cores — one core on every wire — running transversely to the Y-wires. Wires with ferrite cores strung onto them run round one side of the roll, the wires being arranged along the roll at equal intervals.

Installed near the butt-end of the roll is a mechanism for coiling a helix of the wire used to thread the detached row of cores along the X-coordinate direction. The pitch of the helix is equal to the interval between every two wires on the roll. The device is provided with means for straightening the wire coiled into a helix and for positioning the threaded core line into the frame of the flat matrix.

This device can not be used for threading memories in which coordinate wires run along all the axis directions of the Cartesian system.

SUMMARY OF THE INVENTION

An object of the present invention is to provide a method of threading 3-D memories and a device realising thereof that would make it possible to thread memories with wires running along all three axis directions of the Cartesian system, simplify the threading procedure, raise the quality of memory manufacturing, eliminate fatigue of the operator's eyes and increase the efficiency of the threading procedure, as well as to manufacture 3-D memories having high data capacities and using modern subminiature cores.

This and other objects of the invention are achieved by providing a method of manufacturing triple conicidence access 3-D memories which envisages that wires running in the first coordinate direction and having cores strung onto them beforehand are arranged parallel to one another and secured in pick-up point assemblies with tension, then the cores on every wire are detached one by one, oriented in the second coordinate direction and threaded with a wire coiled into a helix, the helix is straightened to form a line of cores threaded in two coordinate directions, then the cores in the line are tested and the line is secured in the place provided for it in the flat matrix being manufactured and the subsequent threading is carried out in a similar, line-by-line, way until the preset number of lines required for the flat matrix is complete, and in which, according to the invention, every core of the detached row is threaded with a wire running in the third coordinate direction form to a flat matrix threaded with wires running along three directions of the Cartesian system, then the matrix is positioned opposite the place of the manufacturing of the subsequent flat matrix. Each matrix is secured in the place provided for it in the 3-D memory being manufactured; and the subsequent threading is carried out in a matrix-by-matrix way until the preset number of matrices required for the 3-D memory is complete, every individual core of a following matrix being threaded in the third coordinate direction with the same wire as the core corresponding to it in the previous matrix.

Preferably every row of detached cores is threaded with wires running in the third coordinate direction.

Preferably also individual rows of detached cores in the first coordinate direction are threaded with wires running only in the third coordinate direction in accordance with the preset topology of the 3-D memory.

In a device for manufacturing 3-D memories which comprises pick-up point assemblies securing wires with cores strung onto them in the Y-coordinate direction, a roll positioned transversely with respect to the wires and provided with a longitudinal guide made as a groove for detaching a row of cores (one core from every wire), a mechanism for coiling into a helix the wire that threades a row of cores in the X-coordinate direction, means for straightening the helically coiled wire and for positioning the threaded line of cores in the place provided for it in the flat matrix, and in which, according to the invention, there is provided a stack of threaded flat matrices said stack being arranged opposite the place of matrix production and having a device for securing the matrices and pick-up point assemblies for holding wires running along the Z-coordinate direction by one of their ends, while the other end of every wire has a needle attached to it, intercepting combs for holding the needles in a row, the interval between every two needles being equal to the pitch of the helix, and means for inserting the needles into the holes of cores located in the longitudinal guide of the roll, said means being made as an intercepting comb displacement guide.

The problem is solved also by means of providing a method of manufacturing triple coincidence access 3-D memories which consists in that wires running along the first coordinate direction and having cores strung onto them beforehand are arranged parallel to one another and secured in pick-up point assemblies with tension, then the cores on every wire are detached one by one, oriented in the second coordinate direction and threaded with a wire coiled into a helix, the helix is straightened to form a line of cores threaded in two coordinate directions, then the cores in the line are tested and the line is secured in the place provided for it in the matrix being manufactured and the subsequent threading is carried out in a similar line-by-line way until the preset number of lines required for the matrix is complete, and in which, according to the invention, the preset number of matrices are arranged in a stack one above another at equal intervals so that respective cores in every matrix are located on direct lines normal to the surface of the matrix, then the cores located on every direct line are threaded with a helically coiled wire along the third coordinate direction of the Cartesian system, the pitch of the wire helix being equal to the interval between adjacent matrices, and finally the helically coiled wires are straightened.

The method of manufacturing 3-D memories described above makes it possible to mechanize the the production of triple coincidence access 3-D memories using ferrite cores, including subminiature ones, which can not be manufactured manually.

The device proposed herein for manufacturing 3-D memories raises the production efficiency, removes overtension on the operatvis eyesight and the nerve system and makes it feasible to make 3-D memories of practically unlimited storage capacity using ferrite cores of any size, including subminiature ones.

BRIEF DESCRIPTION OF THE DRAWINGS

The invention will be better understood from the following description of its embodiments given by way of example with reference to the accompanying drawings, in which.

DETAILED DESCRIPTION OF A PREFERRED EMBODIMENT

Figure 1:
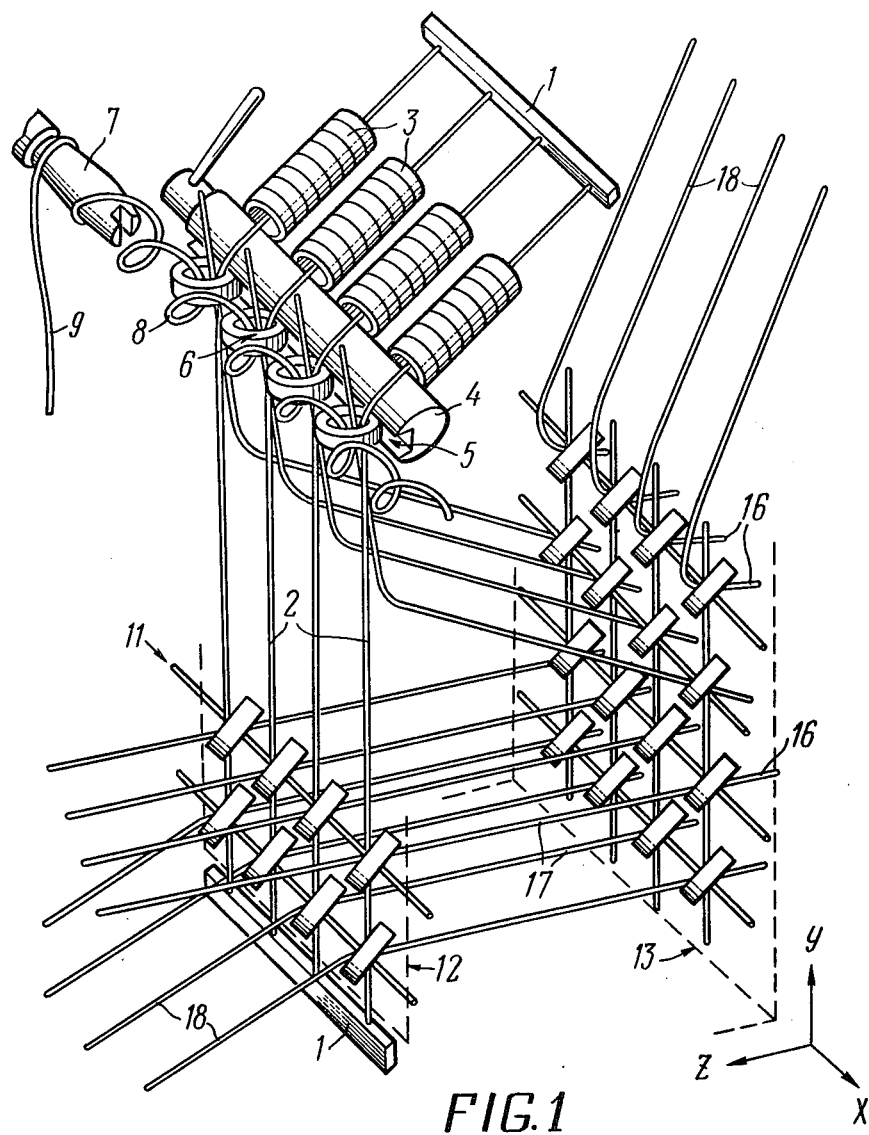
FIG. 1 presents a schematic diagram of the device shown in an axonometric projection illustrating the threading method according to the invention.

A 3-D memory is made of cores arranged in a three-dimensional space and threaded with wires running along all three coordinate directions of the Cartesian system.

Every core may be woven both with all three wires along three directions of the Cartesian system and with two wires one of which is common for all the wires and runs along one coordinate direction of the Cartesian system while the other one threads a part of the cores along the second axis and the rest of the cores, along the third axis of the Cartesian system.

Following is a description of the proposed method of manufacturing triple coincidence access 3-D memories and of the device realising thereof.

The device realising the proposed method of manufacturing 3-D memories comprises pick-up point assemblies 1 (FIG. 1) securing wires 2 with cores 3 strung onto them in the Y-coordinate direction, a roll 4 with a longitudinal guide 5 to detach a row 6 of cores 3 (one core from every wire), the core row being tranversal to the wires 2, and a mechanism 7 for making a helix 8 of a wire 9 which threads the row of cores 3 in the X-coordinate direction.

The device is provided with means 10 (FIG. 2) for straighening the helix 8 and for positioning a row 11 (FIG. 1) of threaded cores 3 in the proper place of flat matrix 12.

The device is also provided with a stack 13 of flat matrices 12 located opposite the place of manufacturing the matrices 12, the stack having means 14 (FIG. 2) for securing the matrices 12 and pick-up point assemblies 15 for securing first ends 16 of wires 17 running along the Z-coordinate direction, while attached to the second end of every one of said wires is a needle 18.

Besides, the device is provided with an intercepting comb 19 (FIG. 3) for fastening the needles 18 so that the interval between every two needles is equal to the pitch of the helix 8. The intercepting comb comprises split plates 20 and 21 fastened with a screw 22.

At least one split plate 20, has grooves 23 for accomodating the needles 18, which are fixed in the grooves 23 with the use of an elastic spacer 24 located between the plates 20 and 21.

The comb 29 is provided with a fastener 25.

The device comprises means for inserting the needles 18 (FIG. 2) into the holes of the cores 3 located in the row 6 in the longitudinal guide 5 of the roll 4, said means being made as a guide 26 for displacing the intercepting comb 19.

Figure 4:
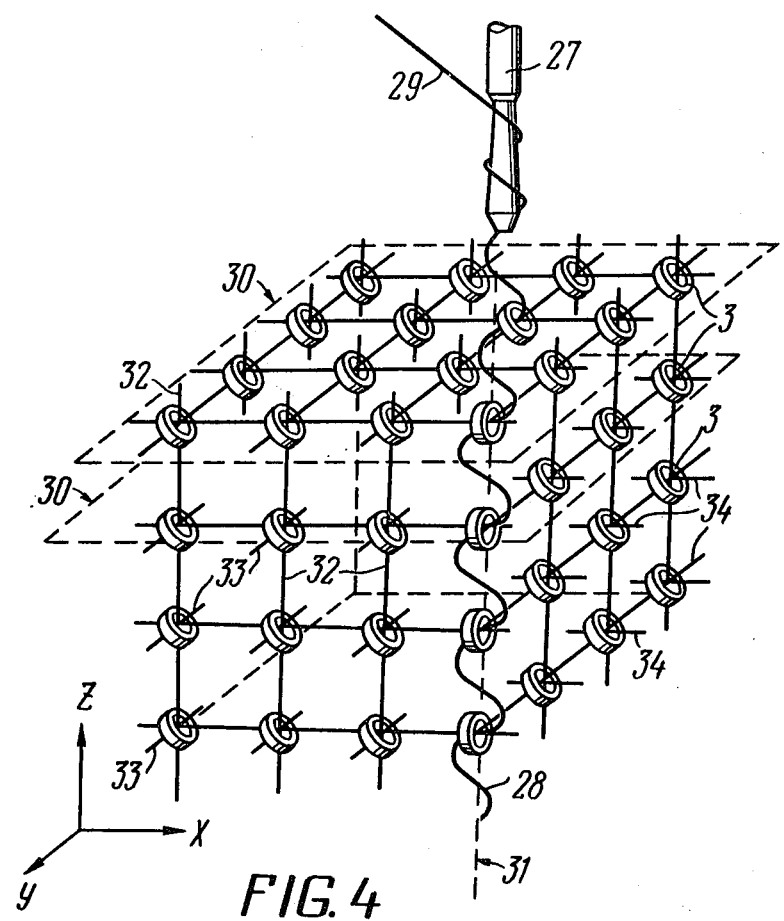
FIG. 4 presents a schematic diagram of the device illustrating a version of the method of core threading according to the invention.

The device may comprise another coiling mechanism 27 (FIG. 4) for making a helix 28 of a wire 29 that threads the cores 3 of matrices 30 placed along straight lines 31 normal to the surfaces of the matrices 30 to form wires 32 running in the Z-coordinate direction.

Wires 33 in the matrices 30 run along the Y-coordinate direction and wires 34, run along the X-coordinate direction.

Consider the operation of the device realising the method proposed herein.

Figure 2:
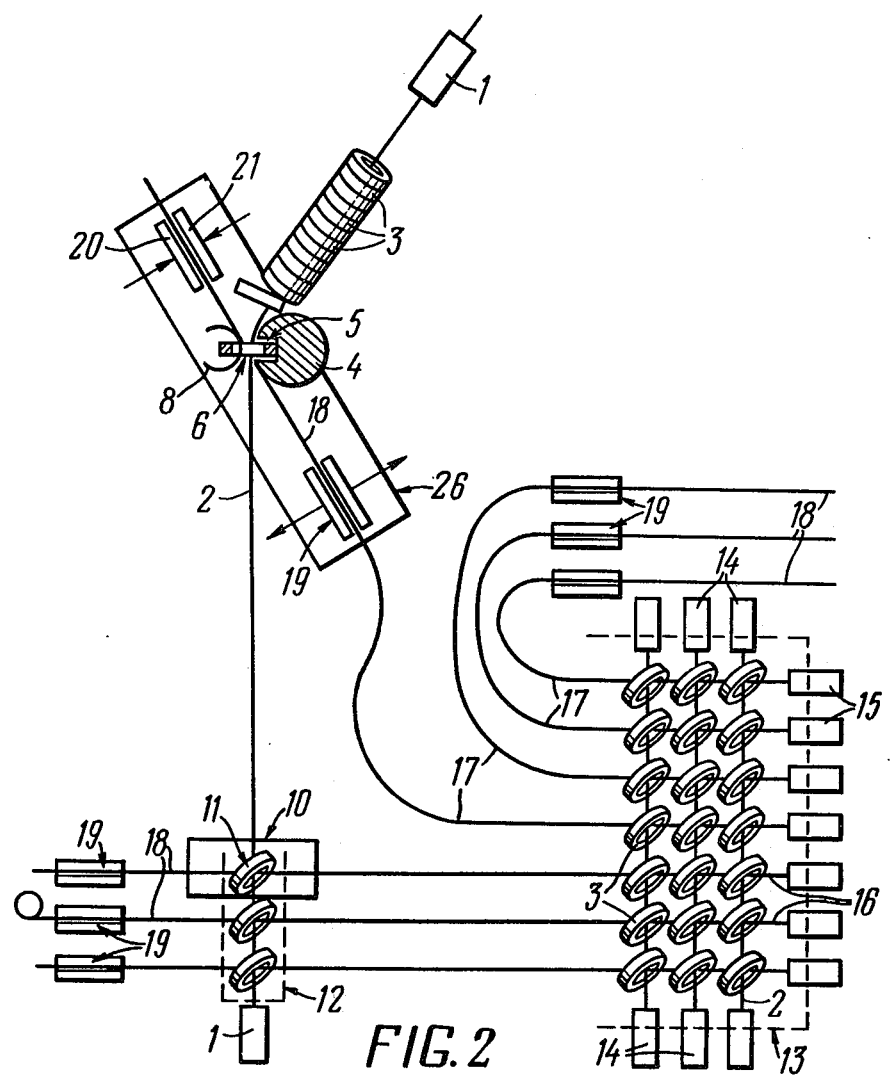
FIG. 2 presents a schematic diagram of the device shown in a front profile projection according to the invention.

FIG. 1 which presents a schematic diagram of the device and illustrates the essence of the proposed method of manufacturing 3-D memories makes it evident that wires 2 running in the Y-coordinate direction bear cores 3 strung onto them beforehand. The wires 2 are arranged parallel to one another and secured with tension in the pick-up point assemblies 1. The mechanism 7 for coiling a wire into a helix is fed with a wire 9.

A 3-D memory is manufactured as follows. A turn of the roll 4 will detach one core 3 on every wire 2 running along the Y-coordinate direction. These cores are oriented in a row 6 running along the X-coordinate direction. The row 6 of cores 3 fixed in the longitudinal guide 5 is threaded in the X-coordinate direction with a wire 9 coiled into a helix with the use of the coiling mechanism 7.

According to the proposed method every core 3 in the detached row 6 located in the longitudinal guide 5 of the roll 4 is threaded with a wire 17 running along the Z-coordinate direction to form a flat matrix 12 threaded with wires along three (X,Y,Z) axis directions of the Cartesian system. This flat matrix 12 is manufactured in the following way.

Figure 3:
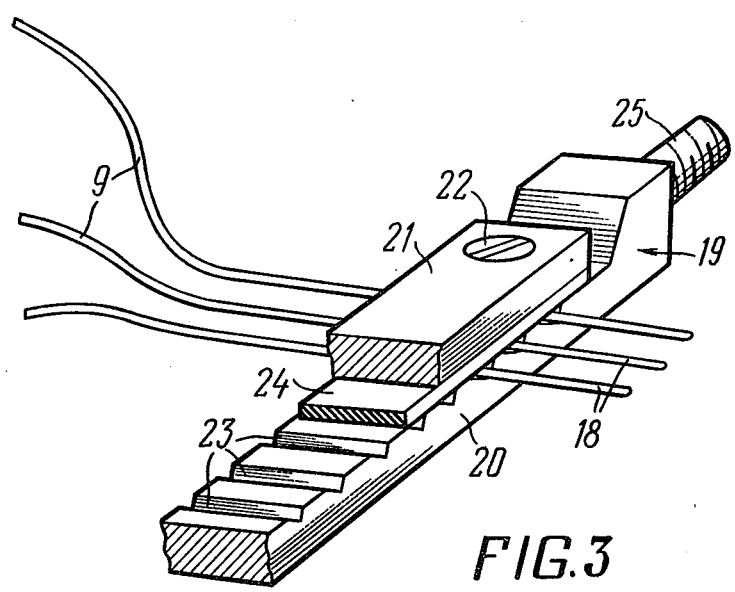
FIG. 3 presents an intercepting comb according to the invention.

A certain amount of wire pieces are prepared in accordance with the number of wires 17 running along the Z-coordinate direction that are required as per the circuit of the 3-D memory. A needle 18 is attached to the first end of every wire 17. The needles 18 with the wires 17 the number of which is equal to that of the cores 3 in the row 6 are fixed in the intercepting combs 19 (FIG. 3). To this end every needle 8 is placed in a respective groove 23 of the plate 20, a spacer 24 is placed above the needles and they are fastened with the plate 21 tightened with the help of screws 22. Loose ends 16 (FIG. 2) of the wires 17 are then secured in the pick-up point assemblies 15 for the Z-direction wires so that the lengths of wires between the comb 19 and the pick-up point assembly 15 is the same and the wires do not cross one another. The first pick-up point assembly 15 is placed in the lowest position in the stack 13 of flat matrices while the intercepting comb 19 (FIG. 3) is attached to the guide 26 (FIG. 2) with the help of the fastener 25 in such a way that the needles 18 fixed in the intercepting comb 19 are located opposite the holes of the cores 3 that correspond to them in the row 6. Then the comb 19 is shifted along the displacement guide 26 so that every needle 18 goes through the respective core 3 in row 6 on the roll 4.

When the needles 18 reappear at the exit of the row 6 of the cores 3 their ends are fastened with another intercepting comb 19, while the first comb is opened and removed from the guide 26. Thus, the needles 18 are intercepted between the combs 19. Then the second intercepting comb 19 which remains closed is also removed from the guide 26, the row 6 of the cores 3 together with the needles 18 that have passed through them is dropped down from the roll 4 along the wires 2. The needles 18 together with the interceting comb 19 are threaded through cores 3 and in case this row 6 of cores 3 has been threaded in the X-coordinate direction as well, the helix 8 is straightened, while the intercepting comb 19 is positioned in the stack 13 opposite to respective pick-up point assembly 15 next to the wire 2 running along Y-coordinate direction. Thus, one line 11 of the flat matrix 12 is complete. A similar procedure is followed to thread a second line 11 and all the other lines 11 of the flat matrix 12 while a new set of wires 17, pick-up point assemblies 15, needles 18 and intercepting combs 19 are used to make every other line II threaded with wires 17 that run along the Z-coordinate direction. Every pick-up point assembly 15 with ends 16 of the wires 17 secured in it is placed in the stack 13 of flat matrices and every intercepting comb 19 is placed at the opposite side with respect to wires 2 running along the Y-coordinate direction.

When the threading of the first flat matrix 12 is complete its wires 2 running along the Y-coordinate direction and the wires of the lines 11 running in the X-coordinate direction are fixed in a matrix fastening device 14. Then the matrix 12 together with the device 14 is shifted along the wires 17 running along the Z-coordinate direction to be secured in its respective place in the stack 13.

All intercepting combs 19 are shifted along the needles 18 to their initial position and transferred towards the stack 13. Wires 17 running along the Z-coordinate direction are bent so that the intercepting comb 19 with needles 18 belonging to the first threaded line 11 of cores 3 is in the uppermost position.

The next step is the threading of the subsequent flat matrix 12. Here, the first core line 11 threaded in two coordinate directions is threaded in the Z-coordinate direction with the use of needles 18 fixed in the intercepting comb 19 which has been placed above the first line 11 of the previous matrix.

The subsequent threading of the 3-D memory is carried out in a similar, matrix-by-matrix, way until the required number of matrices is complete. When the threading is over the needles 18 are cut off the wires 17 and the latter are fastened in the pick-up point assemblies (not shown in the figure) which are identical to the pick-up point assemblies 15 for Z-coordinate wires.

In case of a 3-D memory in which all cores 3 must be threaded with three wires running along three axes of the Cartesian system every row 6 of cores 3 placed in the longitudinal guide 5 of the roll 4 is threaded also with a wire 9 coiled into a helix 8 as well as with wires 17 running along the Z-coordinate direction and attached to needles 18.

Preferably, when manufacturing a triple coincidence access 3-D memory in which all cores 3 must be threaded with two wires, one running along one axis of the Cartesian system, for instance, the Y-axis, and the other, along the X-direction for separate cores 3 and along the Z-direction for the rest of the cores, individual rows 6 of cores 3 detached by rolls 4 are threaded only with wires 9 coiled into a helix 8 and running along the X-coordinate direction while other rows 6 are threaded only with wires 17 attached to needles 18 and running along the Z-coordinate direction.

Rows 6 threaded only with the helix 8 and rows 6 threaded only with needles 18 are alternated in accordance with the topological diagram of the 3-D memory that is being manufactured.

A version of the proposed method of manufacturing triple coincidence access 3-D memories consists in that at first a preset number of ordinary matrices 30 (FIG. 4) is threaded with wires 33 and 34 running only along the X- and Y-coordinate directions. Such matrices can be manufactured both according to the method described above, or following any other known procedure.

Then, the preset number of matrices is arranged in a stack one above another at equal intervals so that all cores 3 of every matrix 30 are located strictly along straight lines 31 normal to the surface of the matrix. The cores 3 located along every straight line 31 are threaded in the Z-coordinate direction of the Cartesian system with a wire coiled into a helix with the help of the helix producing mechanism 27. The pitch of the helix 28 in this case should be equal to the interval between adjacent matrices 30.

When the cores 3 located along all straight lines 31 are threaded with helically coiled wires 28 the latter are straightened and fixed.

The proposed method makes it possible to mechanize the production of triple coincidence access ferrite 3-D memories which can not be manufactured manually.

The proposed device solves the problem of manufacturing 3-D memories using the modern state-of-the-art technology, raises the production efficiency, removes overtension on the eyesight and the nerve system of the assembly man and makes it feasible to make 3-D memories of practically unlimited storage capacity using ferrite cores of any size, including subminiature ones.

What is claimed is:

1. A method of manufacturing triple coincidence access 3-D memories comprising the steps of:
   a. providing a plurality of flat two dimensional matrices, threaded with wires along three directions of the Cartesian system, by the steps of:
     arranging wires prestrung with cores in a first coordinate direction;
     securing said wires under tension in pick-up assemblies;
     detaching the cores on said wires and orienting said cores in rows along a second coordinate direction;
     threading the cores in each of said rows in the second coordinate direction by wires coiled into helices;
     threading the cores in each of said rows in a third coordinate direction;
     straightening each of said helices to form lines of cores along said second coordinate direction; and
     fixing said straightened wires and said pick-up assembly wires in a flat 2-dimensional matrix;
   b. moving said flat two-dimensional matrix along the wires of said third coordinate direction; and
   c. securing said third coordinate direction wires of said matrix in pick-up assemblies of the 3-D memory.

2. The method of claim 1 wherein said step of straightening each of said helices includes the further step of testing each core to insure operability.

3. A method of manufacturing triple coincidence access 3-D memories comprising the steps of:
   a. providing a plurality of flat two-dimensional matrices, by the steps of:
     arranging wires prestrung with cores in a first coordinate direction;
     securing said wires under tension in pick-up point assemblies;
     detaching the cores on said wires and orienting said cores in rows along a second coordinate direction;
     threading the cores in each of said rows in the second coordinate direction by wires coiled into helices;
     straightening each of said helices to form lines of cores along said second coordinate direction;
     fixing said straightened wires and said pick-up assembly wires in a flat two-dimensional matrix; and
   b. aligning said plurality of flat two-dimensional matrices such that respective cores in adjacent matrices are oriented along a third coordinate direction;
     threading said cores along said third coordinate direction with wires coiled into a helices with a pitch equaled to a distance beteen adjacent matrices; and
     straighening said helically coiled wires.

4. The method of claim 3 wherein said step of straighening each of said helices include the further step of testing each core to insure operability.

* * * * *